United States Patent [19]

Lostumo et al.

[11] Patent Number: 4,923,908

[45] Date of Patent: May 8, 1990

[54] EPOXY COMPOSITIONS, AND METHOD OF MAKING SAME

[75] Inventors: Arthur J. Lostumo, Franklin Park; Bernard M. Wiltgen, Villa Park, both of Ill.

[73] Assignee: Zenith Electronics Corporation, Glenview, Ill.

[21] Appl. No.: 257,653

[22] Filed: Oct. 14, 1988

[51] Int. Cl.$^5$ .......................... C08K 3/36; C08K 3/26; B05D 3/02
[52] U.S. Cl. .................................. 523/220; 523/440; 523/443; 523/457; 524/906; 427/386
[58] Field of Search .............. 523/220, 440, 443, 457; 524/906; 427/386

[56] References Cited

U.S. PATENT DOCUMENTS

| | | | |
|---|---|---|---|
| 4,042,550 | 8/1977 | Tuller et al. | 523/457 |
| 4,104,238 | 8/1978 | Chenoweth et al. | 523/220 |
| 4,145,369 | 3/1979 | Hira et al. | 523/220 |
| 4,617,330 | 10/1986 | Thai et al. | 523/443 |
| 4,665,111 | 5/1987 | Hussain et al. | 523/457 |

*Primary Examiner*—Lewis T. Jacobs

[57] ABSTRACT

An epoxy resin composition, especially useful as an encapsulant and exhibiting a low dissipation factor, is prepared from a first component comprising an epoxy of a polyglycidal ether of a polyhydroxyl phenol and filler, and a second component comprising a cycloaliphatic acid anhydride curing agent, filler and catalyst. Each component is mixed separately under high shear, and the filler for each component comprises at least about 50 percent by weight. The two components are admixed, applied as an encapsulant, and cured at an elevated temperature.

43 Claims, 2 Drawing Sheets

EPOXY COMPOSITIONS, AND METHOD OF MAKING SAME

FIELD OF THE INVENTION

This invention relates to epoxy resin compositions, and to the method of making same. In its more specific aspect, this invention relates to a two component epoxy resin composition suitable for encapsulating electrical and electronic devices, which on curing exhibit superior electrical and mechanical properties.

BACKGROUND OF THE INVENTION

Epoxy resin compositions have been designed and used as dielectrics for wires, coils, windings, diodes, resistors, capacitors, and the like, including use as encapsulating compounds for such electrical and electronic devices or apparatus. In the manufacture of such devices protected by an encapsulant, the epoxy composition in the uncured state is applied to the device, and then cured or hardened to provide a relatively strong, infusible, cross-linked polymer. These epoxy resin compositions, when cured or thermoset, provide coatings exhibiting good electrical and physical properties, such as relatively high dielectric strength and volume resistivity, and high tensile, compressive and flexural strengths. The epoxy compounds, however, exhibit certain disadvantages or deficiencies, most notably a relatively high dissipation factor at operating temperatures which, for most such devices ranges from about 100° to 125° C. or slightly higher.

The dissipation factor can be determined by calculating the capacitance and conductance of a dielectric material, which are two fundamental electrical characteristics of such materials. When an alternating electrical field is created within a capacitor, the oscillation is produced at the same frequency but with a phase angle shift (delta). The phase angle shift is measured by comparing the applied voltage to the measured current, for example in a high voltage coil or sweep transformer which has distributed capacity. The tangent of delta is the dissipation factor and represents the resistive element for the dielectric material. These electrical losses are manifested by a temperature rise. The higher the dissipation factor the greater the heat buildup. As the temperature increases, the dissipation factor may increase causing still more increase in temperature. At that point, the device may become involved in a thermal runaway and consequently self-destruct.

The epoxy compositions known and used in the electrical insulating art, e. g. encapsulating art, typically comprise an epoxy resin, and a curing agent or hardener. Depending on the end use and properties sought for the end product, the epoxy may be powder or liquid at room temperature, and very typically such as for bisphenol-A based resins have an epoxide equivalent weight ranging from about 170 to 750. The curing agents most commonly used for these epoxy resins include the amine type agents such as aliphatic polyamides which permit cross-linking at about room temperature, and acid anhydride type agents such as maleic anhydride or phthalic anhydride which require cross-linking at elevated temperatures. Also, it is known to incorporate small amounts of a catalyst or accelerator such as imidazole or imidazole derivatives, tertiary amines or stannous salts. Numerous fillers, such as silica, hydrated alumina, calcium carbonate, magnesium silicate, aluminum silicate, antimony oxide or zirconium silicate, have been added to the resin compounds to improve such properties as dielectric strength, mechanical strength, and flame retardancy, as well as provide for cost reduction.

However, known epoxy compositions, in addition to the disadvantages noted above, during handling are sensitive to ratio changes between the epoxy resin and the hardener, and frequently possess a short shelf life. Certain of these deficiencies have been overcome by one or more techniques shown in the art. For example, U.S. Pat. No. 3,909,408 to Ogata et al discloses admixing with the resin an organo-tetra-substituted borate of imidazole or imidazole derivative in order to improve storage stability yet provide rapid curing on heating. The resin composition also may include a small amount of a curing catalyst such as an acid anhydride, as well as fillers or colorants, depending on the end use, and mixing is accomplished by applying a shearing force such as by an extruder, ribbon mixer, or the like. High shear for mixing epoxy powder and liquid catalyst is disclosed in U.S. Pat. No. 4,558,077 to Gray, for use in making a bonding agent for magnets. In order to prolong the pot life or working or handling time, U.S. Pat. No. 4,009,141 to Nichols et al discloses a two component system, one of which is a cycloaliphatic epoxy resin and filler and the other is the anhydride hardener and filler, and the two components are admixed just prior to the molding operation.

In the manufacture of the epoxy compounds, any marked sensitivity to ratio changes between resin and hardener is still a deficiency because upsets occur during production, and equally important there is the need to lower the dissipation factor of the cured product while still controlling or lowering costs. It is the purpose of this invention to provide for these advantages, as well as to overcome the other deficiencies of the prior art. These together with other objects and advantages will best be understood by referring to the following description of the invention, and to the accompanying drawings.

DESCRIPTION OF THE INVENTION AND PREFERRED EMBODIMENTS

Figure 1:
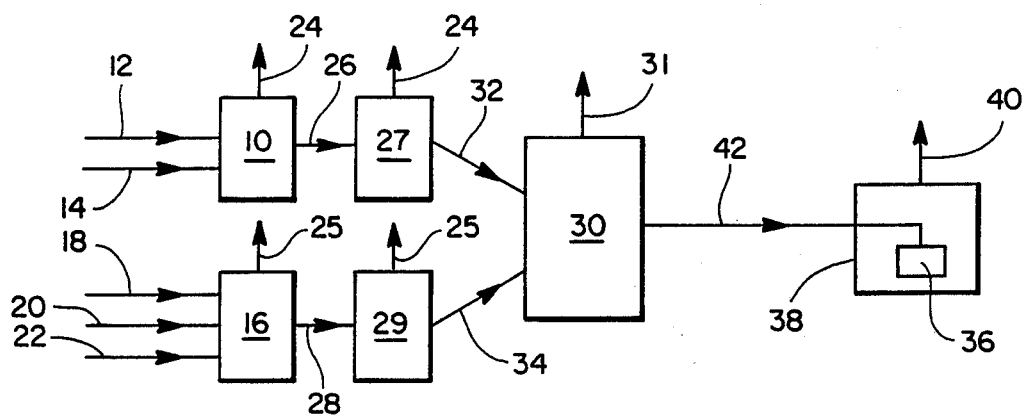
FIG. 1 is a block diagram illustrating a process in accordance with this invention.

In accordance with our invention, there is provided a two-component epoxy resin composition suitable for encapsulating electrical and electronic devices and apparatus. On curing, the encapsulant exhibits superior properties, particularly a relatively flat dissipation factor curve with operating temperature. The epoxy resin composition is made by preparing a first batch or mixture comprising an epoxy of a polyglycidal ether of a polyhydroxyl phenol and filler material, and a second batch or mixture comprising a cycloaliphatic acid anhydride curing agent, filler material and catalyst. The epoxy resins useful for our invention are liquids at room temperature, and the hardeners are liquids at room temperature or become very fluid liquids at temperatures up to about 40° C. or slightly above and are heated to melting prior to mixing. The filler materials for both mixtures are finely divided solid ingredients, and comprise at least about 50 percent by weight of each mixture. For each of the two batches, the fillers comprise silica and calcium carbonate, but additionally the second batch includes hydrated alumina. Both mixtures are prepared by applying a high shear force to ensure wetting of the fillers by the liquids and uniform dispersion of all ingredients. The two mixtures are subsequently admixed, and the resulting admixture or potting compound applied to the electrical or electronic device. The potting compound is then heat cured thereby encapsulating the device with a hardened or cured resin.

For any one or more of the admixing steps or the final encapsulating step, a vacuum may be applied to degas the composition. Thus air entrained in the compound or volatile organics evolving from one or more of the ingredients may be removed by drawing a vacuum on the setup, including the final encapsulating step of the device. Applying a vacuum during the encapsulating step also ensures good penetration of the epoxy composition into the interstices of the device such as fine wire, tightly wound coils.

In accordance with another embodiment of the invention, we provide a method for encapsulating electrical or electronic devices or apparatus. Such devices or apparatus include those where it is necessary or desirable to protect or coat the device with a dielectric. The final admixture of the two-component system, which may be mixed in a meter-mix machine, is applied, poured, injected, cast, or otherwise coated onto the device. The resin composition is cured at an elevated temperature, thereby providing a product possessing superior properties, particularly a relatively low dissipation factor measured at a frequency of 100 kHz to 125° C.

Where desired, the epoxy resin composition, which had been cured at one temperature, may be postcured at a higher second temperature to develop more fully the electrical and/or physical properties of the cross-linked encapsulant.

As used in the specification and the appended claims, the term "encapsulate" means to completely saturate and engulf the device to protect it from air with an epoxy thermoset composition. This protection may be achieved, for example, by coating, covering, enveloping, potting, or the like. In one typical encapsulating procedure, the device is placed in a container which is then filled with the epoxy resin polymeric composition, and the resin then cured. The container becomes the exterior wear surface of the device. The epoxy compositions of this invention are also useful as a casting material where the container is a temporary mold, and the cured epoxy insulation becomes the exterior wear surface, or in conformal coating by providing a relatively thin coating over a printed circuit board. Thus, the epoxy compositions of our invention are useful for encapsulating any of a variety of electrical and electronic devices or apparatus. Such devices include, for example, transformers, capacitors, resistors, coils, windings, electronic devices, diodes, printed circuit boards, and the like.

In a preferred embodiment of the invention, a two component epoxy resin system is prepared by providing a first component or mixture or batch comprising resin and filler, and a second component or mixture or batch comprising hardener and filler. The two components are meter-mixed just prior to application, then applied as an encapsulant to the electrical or electronic device or apparatus, and the encapsulant cured to provide an infusible dielectric for the device. The first component is prepared by mixing an epoxy resin selected from a polyglycidal ether of a polyhydroxly phenol with suitable filler materials. The epoxy resins suitable for the invention are liquid at room temperature because such resins provide a more suitable matrix or vehicle for the fillers in that the fillers can be more uniformly admixed with the resin, and further can be more readily handled by conventional meter-mixing machines and be more easily mixed with the second batch. Thus, the epoxies are characterized by an epoxide equivalent weight ranging from about 170 to 200, and more preferably from about 175 to 190, and a viscosity ranging from about 40 to 180 poise at 25° C., and more preferably from about 65 to 95 poise. We have found that if the epoxide equivalent weight is above about 200, the composition is too viscous to handle in an expedient manner with conventional equipment. The epoxy resins of this type and possessing these properties are readily available and are sold commercially in undiluted liquid form, for example by Shell Chemical Company under the tradenames "EPON" such as EPON 826, and by HiTek Polymers, Inc., under the tradename Epirez 509. We have found that these epoxy resins provide an excellent combination of cure rate when combined with and reacted with the cross-linking agent, and when cured exhibit strong adhesion to the device and its container, and further impart excellent electrical and physical properties to the cured product, as explained below in greater detail.

The epoxy resin is admixed with finely divided filler comprising silica and calcium carbonate by applying a high shearing force. The term "high shear force" as used herein and in the appended claims means that shear force applied during mixing of the ingredients being sufficiently high to ensure on impact or impingement the substantially complete disagglomerating of filler particles to cause wetting of the discrete particles by the liquid epoxy resin and the substantially complete dispersion of the solid filler particles in the resin matrix or vehicle. When good dispersion and wetting are achieved, you substantially inhibit or prevent the agglomeration of particles and the settling out of the filler materials. Good uniform dispersion of the filler in the resin matrix imparts good physical strength to the end product. For purposes of our invention, a high shearing force may be accomplished by admixing the ingredients, for example, in a Cowles dissolver equipped with a Cowles blade rotating at 600 to 800 rpm with a peripheral speed of 50 to 80 feet per second, or in a paint mill, or in a ball mill, or in a fluid bed machine manufactured by Processall Inc. Cincinnati, Ohio, or in a Waring blender with the blade rotating at about 20,000 rpm, or the like. The epoxy resin and fillers, in measured quantities, may be added simultaneously or sequentially to the mixer provided with a high shear means. It is preferable first to add a measured quantity of resin to the mixer, and, with the shear force operating, then add the measured quantities of filler. During admixing, the temperature usually rises gradually to about 50° to 90° C. The resin and fillers may be preheated to about 40° to 105°

C. to dry the materials and to facilitate mixing. The amount of filler or the proportion of filler to epoxy depends largely on the properties of the individual fillers, the proportional amounts of each filler, the use of any other filler materials, the type and amount of fillers used in the second batch (described below), and the properties sought for the cured product. We have found it desirable that the first component or batch comprises at least about 50 percent by weight filler, and preferably about 60 to 65 percent by weight, the remainder being epoxy resin and other additives, if used. It should be understood that the filler materials used for either or both batches may not be necessarily pure materials, but may contain impurities or inert ingredients. Silica, e.g. quartz, is a particularly useful filler in that it improves the dielectric constant and dissipation factor of the cured product. In addition, the device has breakable elements or constituents, e.g. ceramic resistive substrates, glass bodied diodes, etc., and therefore the cured product should adhere to such metal, glass or ceramic elements or constituents, and the silica usually imparts an over-all coefficient of thermal expansion more closely matching that of these elements than the epoxy resin, per se. Thus, a substantial amount of silica imparts a closer thermal expansion match between the hardened composition and the several breakable elements of the device. The calcium carbonate, in addition to the foregoing properties stated for silica, helps to keep the silica in suspension. Also, both filler materials reduce the over-all cost of the composition. Thus, less than the stated amount of fillers used in the resin compositions tends to deplete the properties of the end product. The upper limit, on the other hand, is governed largely by the ability of the machinery to handle and mix the ingredients. Further, we have found that the particle size for the filler materials should be sufficiently fine to ensure a high degree of dispersion. Thus, the silica suitably has a particle size of 99% finer than 60 microns, preferably finer than about 44 microns, and the calcium carbonate suitably has a particle size of 99.9% finer than 20 microns, preferably finer than about 12 microns. If the materials are too fine, one encounters difficulty in handling and mixing, but this can depend on the equipment used in the operations.

The second mixture or batch of the two component system is prepared by admixing a cycloaliphatic acid anhydride curing agent, filler and catalyst. The curing or cross linking agent may be any of a number of such compounds known in the art, and those useful for this invention are low viscosity liquids at room temperature or rendered liquid at temperatures up to about 40° C., or slightly higher, to which they are preheated before mixing. In addition, these curing agents exhibit a high combining ratio thereby making measurements easier and adapting well to conventional meter-mix-dispense equipment. Useful examples of these agents include methyl tetrahydrophthalic anhydride, hexahydrophthalic anhydride, dimethyl-substituted butenyltetrahydro-phthalic anhydride, maleic anhydride adduct of methylcyclo-pentadiene, and alkylated endoalkylenetetrahydrophthalic anhydride.

It is well understood in the art that upon reaction between the epoxy resin and the curing agent there is formed a thermoset or cross-linked composition. In order to ensure substantially complete cross-linking of the epoxy, the approximate ratio of epoxy resin to acid anhydride curing agent be 100 parts by weight of raw resin to about 70 to 115 percent of the stoichiometric amount of raw anhydride, and preferably about 90 to 95 percent. The stoichiometric amount of anhydride per 100 parts resin is calculated by the formula:

Molecular weight of anhydride Number of anhydride groups $\times$ 100 Epoxide equivalent weight 1

It should be understood, however, that by reason of our invention the cured composition is characterized by a relatively flat curve for the dissipation factor not exceeding more than about 1% measured at a frequency of 100 kHz to 125° C., or about 1.5% to 140° C. Hence, this ratio of resin to hardener can be varied over a wide range without deteriorating the dissipation factor, which is particularly advantageous in the actual commercial production because there are momentary upsets in the metering operation resulting in a spurt of one mixture, whereby the ratio of the two batches applied to the device is outside the manufacturing specifications. This ability to achieve and maintain a low dissipation factor, along with an insensitivity to ratio changes, is not shown in the art. The choice of resin and curing agent will depend largely on the amounts of the other ingredients and the properties desired for the end product, and these two constituents can be selected and the amounts determined through experimentation or by known reactions by one skilled in the art.

As in the case of preparing the first batch, the liquid curing agent is charged to a high shear mixer. The filler materials may be added to the hardener, and the ingredients are thoroughly admixed by applying a high shearing force. Where desired, all ingredients can be added simultaneously and the batch then mixed. Preferably, a measured amount of curing agent is added first to the mixer, and with the shearing blade operating, the fillers are added. During mixing, there is a temperature rise, usually to about 50° to 90° C. The curing agent and fillers, may be preheated to about 40° to 105°0 C. just prior to mixing to dry the materials and to facilitate mixing. Here, too, it is important to achieve substantially complete wetting of the filler by the liquid hardener and to provide for a substantially uniform admixture, and therefore mixing is conducted by applying a high shear force. The filler materials for this second mixture or batch comprise silica, hydrated alumina and calcium carbonate, and the filler comprises at least about 50 percent by weight of the mixture, preferably about 60 to 75 percent. As stated above, the silica and calcium carbonate attribute beneficial properties to the process and composition. The hydrated alumina contributes essentially the same properties as the silica, and additionally imparts flame retardancy to the cured product. The filler material, in discrete particulate form, should be sufficiently fine to obtain uniform dispersion, as explained above, and thus the silica and calcium carbonate employed in the second mixture have essentially the same particle size as those used in the first mixture. The alumina trihydrate should have a particle size of 80% finer than about 100 microns, preferably finer than about 80 microns.

A disadvantage in using the acid anhydride curing agents of this invention is that these agents require a relatively long time and moderately elevated temperatures for complete cure with the resin. In order to overcome this disadvantage, a small amount of a catalyst is incorporated into the composition in order to accelerate the cross-linking process. Thus, a catalytic amount of a catalyst is added to the second mixture, and all of the ingredients are thoroughly admixed to provide a substantially uniform dispersion. Imidazoles are particularly useful for the process of this invention, and include, for example, 2 ethyl 4 methyl imidazole, 1 methyl imidazole, 2 methyl imidazole, n-butyl imidazole, and the like. Additional catalysts include tertiary amines such as benzyldimethylamine, 2,4,6-tri (dimethylaminoethyl) phenol, and dimethylaminomethyl phenol. The amount of catalyst can vary over a broad range depending largely on such factors as choice and amounts of resin and hardener. Generally, this amount may range from about 0.05 to 3.0 percent by weight of the second mixture, preferably from about 0.1 to 0.3 percent, but this amount may vary depending upon the temperature and time required for cure.

The two mixtures described above may be stored separately until the final encapsulating and curing steps. Upon application as an encapsulant, a measured amount of each mixture is delivered to a final mixer, and the two batches uniformly admixed by conventional mechanical means. The resulting admixture is then applied to the electrical or electronic device or apparatus, such as by potting a transformer or casting a printed circuit board. One useful meter mix machine is an APC machine made by Automatic Process Controls Inc., Union N.J., which meters the hot material out of vacuum through a Christmas tree mixer and dispense nozzles into the devices to be encapsulated, all under vacuum. It is desirable to apply the composition at a moderately elevated temperature of at least about 60° C., and preferably about 75° to 95° C., because the warm temperatures facilitate flow and metering of the composition. The applied composition in the set-up is then heat cured at an elevated temperature and for a time sufficient to substantially cure the encapsulant. The time and temperature can vary depending on the choice of ingredients, including the amount of accelerator, and can be determined experimentally by one skilled in the art. Also, the higher the cure temperature the shorter the time. We have found it desirable to cure the compositions of our invention at about 105° C. or above, but usually there is no need to exceed about 150° C. and for a time of about 2 to 4 hours, but this time also can be varied.

It is not uncommon for gasses to be entrained, trapped or occluded in the compositions, and these entrained gasses can have a deleterious effect on the properties of the end product. For example, air bubbles trapped in the cured product are functionally undesirable in high voltage uses such as in transformers. The entrained gas may be air in the epoxy resin as received, or air may be entrained in the compositions during mixing and dispensing, or volatile organics may evolve from one or more of the ingredients during mixing and become entrained in the composition. It therefore is desirable to draw a vacuum on the compositions during any one or all of the admixing operations and during the encapsulating operation. In this manner, the compositions are degassed of the entrained air and volatile organics We have found that a vacuum of about 1 torr, preferably about 0.5 torr or lower, is sufficient at the mixing, dispensing and encapsulating temperatures discussed above.

It is sometimes desirable to post-cure the encapsulant by a second heat curing step to develop more fully the physical and/or electrical properties of the cross-linked composition. This post-cure operation is performed after the encapsulant has been hardened. The need for a post-cure will depend largely on the choice of ingredients and the end properties sought for the final product. Curing first at a lower temperature and then post-curing at a higher temperature might be advantageous in lowering the temperature the material will see due to exotherms, usually concentrated in the center of the mass. Curing at a single higher temperature tends to build into the mass more stress because the exotherms raise the temperature. We have found, for example, that a composition for use as a potting compound for transformers when cured, after pouring, at a temperature of 105° C. for 2 ½ hours had a dissipation factor of 1.2 measured at 125° C. and a frequency of 100 kHz, but when post-cured at temperatures ranging between 125° and 150° C. for 1 hour, the dissipation factor remained essentially flat at about 0.6. The resulting post-cured product compared favorably to the same composition cured only at 125° C. for 2 ½ hours.

It may be desirable to include one or more optional ingredients to facilitate the process or to improve the characteristics or performance of the cured composition. For example, optional ingredients can include defoaming agents, pigments, surfactants, antistatic agents, flame retardants, and the like. These ingredients may be mixed with either of the two batches, or with both, or with the final admixture.

Referring now to the drawing, there is shown an embodiment of the invention for conducting a process in preparing a potting compound such as for a transformer. Each of the ingredients are stored separately and passed to a suitable mixer. Thus for the epoxy resin mixture, the resin is charged to a high shear mixer 10 via conduit 12, preferably with the shear force operating, and filler materials are then charged to the same mixer via conduit 14. It should be understood that each filler is desirably passed to the mixer in a separate line, but this specific feature is not shown because the number of different fillers can vary. Similarly, the curing agent, filler and catalyst are charged to high shear mixer 16 through lines 18, 20 and 22, respectively. Each batch is admixed by applying a high shearing force and while drawing a vacuum on the mixers via lines 24 and 25 to remove entrained gasses. Each batch may be sent to storage, such that the resin mixture is passed through conduit 26 to holding tank or drum 27 and the hardener mixture is passed via line 28 to holding tank or drum 29. Upon application of the composition, the mixtures are drawn from storage to a meter mix machine. It is desirable to heat the mixtures either separately or together in the mixer at a temperature of 60° C. or above, preferably 75° to 95° C. A measured amount of the resin mixture is passed to the mixing machine 30, maintained under vacuum by line 31, through conduit 32. Likewise, a measured amount of the hardener mixture is passed to machine 30 via line 34. The transformer 36 is placed in a vacuum chamber 38 having a vacuum line 40, and the potting compound poured to the transformer through line 42. The device is removed from the vacuum chamber, and then placed in an oven (not shown) where the encapsulant is then heat cured for the required time and temperature. Alternatively, the two mixtures, which have been preheated, can be measured and stirred by hand, then poured into the device held in a container, the vacuum applied to remove entrained gasses, and then cured.

The invention is further illustrated by the following examples:

In preparing the two separate mixtures or components, all of the ingredients were preheated to a temperature of about 75° C. and then admixed. Thus, a first mixture or batch was prepared by adding to a Waring blender 184.5 grams of diglycidal ether of bisphenol-A (Shell Chemical, "Epon 826"), 219.2 grams of ground silica, 99% finer than 44 microns (Ottawa Industrial Sand Co.,Ottawa, Ill., "Sil-Co-Sil 400"), and 57.7 grams of calcium carbonate, 99.9% finer than 12 microns (Genstar Stone Products Co., Hunt Valley, Md., "Camel-Wite"). The ingredients were mixed at high shearing force for four minutes.

A second mixture or batch was prepared in essentially the same manner as the first batch by adding 155.8 grams of methyl tetrahydro-phthalic anhydride (Lindau Chemicals, "Lindride 12"), 115.4 grams of "Sil-Co-Sil 400", 69.2 grams "Camel-Wite", and also 184.5 grams of alumina trihydrate, 80% finer than 80 microns (Solem Industries Inc., Norcross, Ga., "SB-30"). Additionally there was added 1.15 grams of imidazole (Anhydrides and Chemicals Inc., "AC-PI"). Mixing was maintained for four minutes.

The two batches were subjected to a vacuum of about 100 millitorr under agitation for about three minutes, and then admixed in the ratio of 100 parts of the epoxy resin component to 114 parts of the hardener component. This ratio provided about 93 percent of the stoichiometric amount of hardener for the resin, or a raw epoxy resin to raw acid anhydride hardener ratio of about 1.18. The warm mixture was used to impregnate high voltage sweep transformers. The epoxy resin composition was added to the transformers, then placed in a vacuum chamber, and the pressure reduced to at least about 1 torr. After vacuuming was completed, the devices were transferred to an oven, and some compositions were cured at 105° C. for 2 and ½ hours, and others at 125° C. for 2 and ½ hours.

The resulting products were evaluated for dissipation factor by comparison to commercially available epoxy compositions sold and used as sweep epoxy compounds for transformers. In conducting a dissipation factor test, a Johnson variable air gap capacitor, which had been precleaned, was placed in a cup provided with two leads and a thermocouple. The cup was then filled with compound, a vacuum drawn to at least 1 torr, and the composition cured at an elevated temperature. The two leads are then connected to a capacitance bridge and the thermocouple to a thermometer. This assembly is then placed in an air circulating oven, and the oven set at 150° C. The cured resin composition is then monitored for dissipation factor measured through a temperature range of 40° to 140° C. at 100 kHz.

Figure 2:
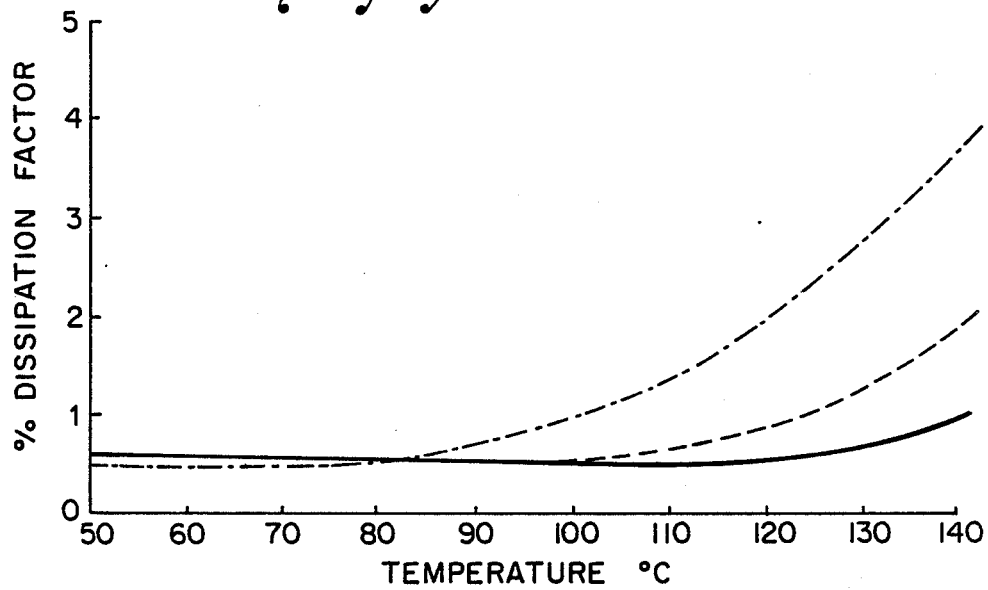
FIG. 2 is a graph showing percent dissipation factor for epoxy resin compositions cured at 125° C. for 2 ½ hours.

FIG. 2 shows the dissipation factor curves for the epoxy composition made in accordance with the above example and cured at 125° C. for 2 and ½ hours (the solid line curve) and for two commercial epoxy resin compositions used for encapsulating sweep transformers. Both commercial compositions are proprietary, but are known to contain epoxy resin, acid anhydride hardener and about 60% by weight fillers. These compositions were mixed in accordance with the manufacturers' recommendations. One such commercial product is sold under the tradename "Quadrant Flyback A2288/B2289" by Quadrant Chemical Corp., McKinney, Tex. (shown in the graph as the broken line curve), and the other under the tradename "Biwax 79.1989" by Biwax Corp. DesPlaines, Ill. ( shown in the graph as the dash-dot-dash curve). The absissa of the curves represents the temperature through which the compositions were monitored, and the ordinate represents the percent dissipation factor. The composition of this invention shows a relatively flat percent dissipation factor curve, remaining at about 0.6% through a temperature of 125° C., and a small increase to about 1% at a temperature at 140° C. In contrast, both commercial compositions begin showing an increase at much lower temperatures, reaching or exceeding 2% at 140° C. Thus, the use of the epoxy resin compositions of this invention substantially decreases or minimizes the occurrence of thermal runaway during operating life.

Figure 3:
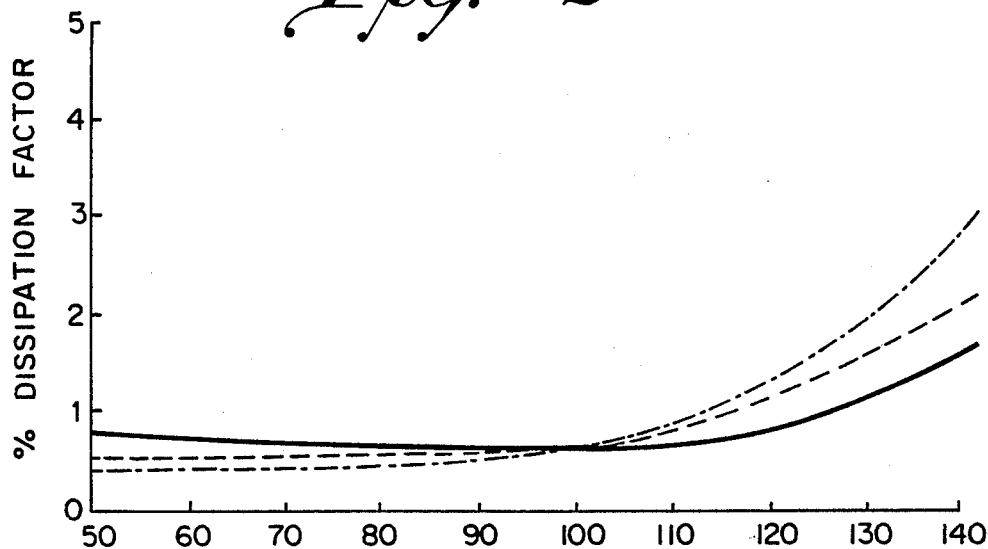
FIG. 3 is a graph similar to FIG. 2, but the resin compositions were cured at 105° C.

In FIG. 3, the percent dissipation factor is shown for resin compositions cured at 105° C. for 2 and ½ hours. This figure again shows the superior performance of the composition of this invention with the percent dissipation factor being about 1.2% at 125° C. and about 1.7% at 140° C. These results are markedly less than for both of the commercial compositions.

Figure 4:
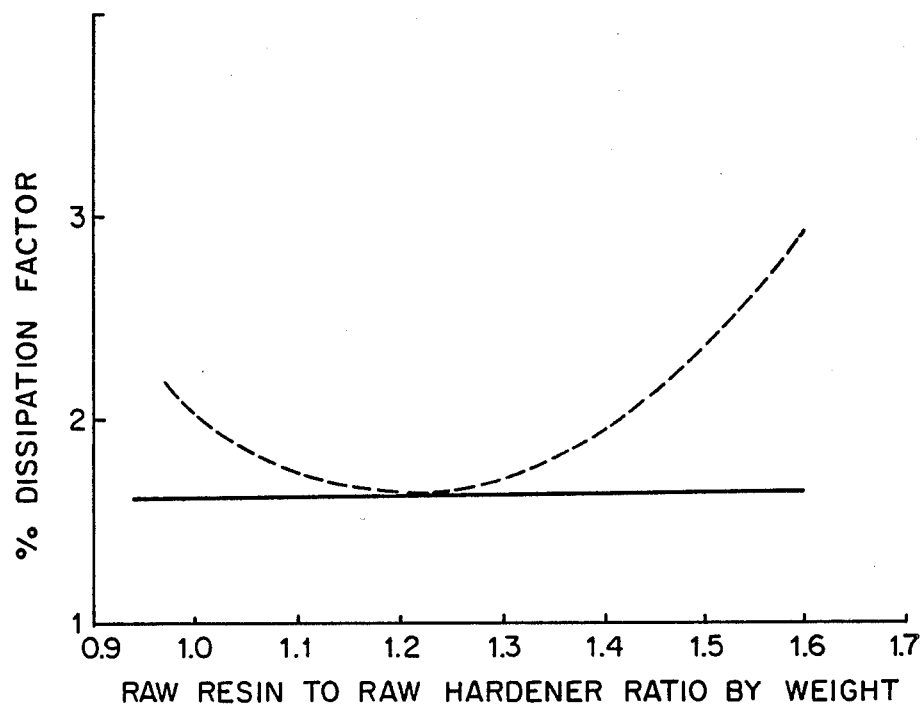
FIG. 4 is a graph showing percent dissipation factor measured at 125° C. for different ratios of raw epoxy to raw acid anhydride.
Figure 5:
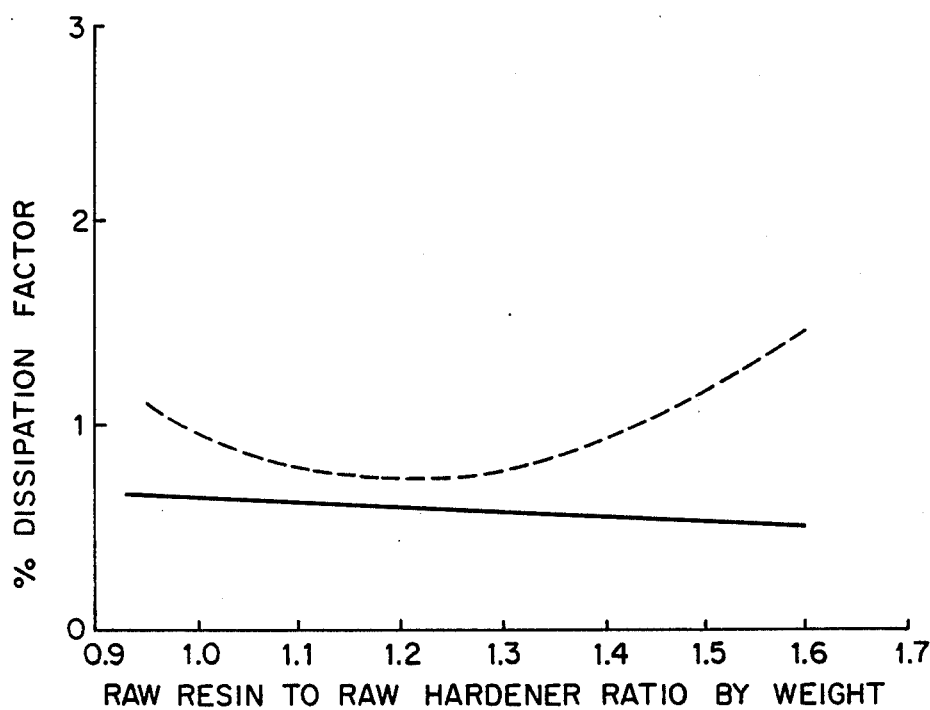
FIG. 5 is a graph similar to FIG. 4 but the dissipation factor is measured at 100° C.

FIGS. 4 and 5 show the percent dissipation factor comparing the composition of this invention (the solid line curves) with the Quardant Flyback composition (the broken line curves), measured at 100 kHz and at 125° C. and at 100° C., respectively. For both Figures, the percent of raw epoxy to raw acid anhydride was varied over a relatively broad range of about 0.9 to 1.6. The dissipation factor curve (the solid line curve) for our composition remained essentially flat throughout this range, further demonstrating that our composition is insensitive to ratio changes over a very broad range. This feature is particularly advantageous in commercial or plant operations where mechanical upsets can occur. These results show the superiority of our product to that of a commercial product tested in an identical manner. The broken line curve for the commercial product showed an optimum dissipation factor at about 1.25, which is the manufacturer's recommended ratio, and shows the composition to be relatively sensitive to ratio changes.

The composition for the example above, and cured at 125° C., was tested for other properties, and the results are as follows:

Flammability test, U.L 94, third edition:

|  | 1.6 mm V-1 |  |
| --- | --- | --- |
|  | 3.2 mm V-0 |  |
|  | 12.7 mm V-0 |  |
| Tensile strength, | ASTM D-638, @ 23° C. | 4,570 psi |
| Tensile modulus, | ASTM D-638, @ 23° C. | 2,260,700 psi |
| Flexural strength | ASTM D-790, @ 23° C. | 9,140 psi |
| Flexural modules | ASTM D-790, @ 23° C. | 877,000 psi |
| Impact strength, | ASTM D-256, @ 23° C. | 0.5 ft-lbs/in |

The foregoing illustrates the advantages of our invention. It is to be understood that the composition, and process of making same, herein described may be varied without departing from the invention, and that the use of products is not limited to any specific field or fields of application.

We claim:

1. A method of making an epoxy resin composition, which comprises: (A) preparing a first mixture comprising (i) an epoxy resin consisting essentially of a polyglycidal ether of a polyhydroxyl phenol and liquid at room temperature and (ii) finely divided solid filler of silica, and calcium carbonate, said filler being at least 50 percent by weight of said first mixture, and admixing said epoxy resin and said filler by applying a high shearing force; (B) preparing a second mixture comprising (i) a cycloaliphatic acid anhydride curing agent, (ii) finely divided solid filler of silica, hydrated alumina, and calcium carbonate, and (iii) a catalytic amount of a catalyst for accelerating the curing of step (C) below, said filler being at least 50 percent by weight of said second mixture, and admixing said curing agent, said filler and said catalyst by applying a high shearing force; and (C) thereafter admixing said first and second mixtures and curing said epoxy resin at a elevated temperature.

2. A method according to claim 1 wherein said epoxy resin has an epoxide equivalent weight of 170 to 200, and a viscosity of 40 to 180 poise at 25° C.

3. A method according to claim 1 wherein said epoxy resin is diglycidal ether of bisphenol-A.

4. A method according to claim 1 wherein said acid anhydride curing agent is methyl tetrahydro-phthalic anhydride.

5. A method according to any of claims 1, 2, 3 or 4 wherein for said first mixture said filler comprises at least about 40 percent by weight of silica having a particle size of 99% finer than 44 microns and 10 percent by weight of calcium carbonate having a particle size of 99.9% finer than 12 microns; and for said second mixture said filler comprises at least about 30 percent by weight of alumina trihydrate having a particle size of 80% finer than 80 microns, 20 percent by weight silica having a particle size of 99% finer than 44 microns and 10 percent by weight of calcium carbonate having a particle size of 99.9% finer than 12 microns.

6. A method according to any of claims 1, 2, 3 or 4 wherein said catalyst is an imidazole.

7. A method according to claim 5 wherein said catalyst is an imidazole.

8. A method according to claim 6 wherein said catalyst is present in said second mixture in an amount ranging from about 0.05 to 3.0 percent by weight.

9. A method according to claim 5 wherein said catalyst is present in said second mixture in an amount ranging from about 0.05 to 3.0 percent by weight.

10. A method according to claim 8 wherein said range is from about 0.1 to 0.3 percent.

11. A method according to claim 9 wherein said range is from about 0.1 to 0.3 percent.

12. A method according to any of claims 1, 2, 3 or 4 wherein the ratio of raw epoxy resin to raw acid anhydride curing agent is, per 100 parts by weight of raw resin, from about 70 to 115 percent of the stoichiometric amount of raw acid anhydride.

13. A method according to any of claims 1, 2, 3 or 4 wherein during any of said admixing steps a vacuum is applied to remove entrained air and volatile organics.

14. A method according to any of claims 1, 2, 3 or 4 wherein said curing step is at a temperature of at least about 105° C.

15. A method according to claim 14 wherein the resulting cured composition is post-cured at a temperature of least about 125° C.

16. A method of making an epoxy resin composition, which comprises: (A) preparing a first mixture comprising (i) an epoxy resin consisting essentially of a diglycidal ether of bisphenol-A and (ii) finely divided solid filler of silica and calcium carbonate, said filler being at least 50 percent by weight of said first mixture, and admixing said epoxy resin and said filler by applying a high shearing force and while drawing a vacuum on said first mixture; (B) preparing a second mixture comprising (i) methyl tetrahydro-phthalic anhydride as curing agent, (ii) a finely divided solid filler of alumina trihydrate, silica and calcium carbonate, and (iii) a catalytic amount of imidazole for accelerating the curing of step (D) below, said filler being at least 50 percent by weight of said second mixture, and admixing said curing agent, said filler and said imidazole by applying a high shearing force and while drawing a vacuum on said second mixture; (C) while drawing a vacuum, admixing at an elevated temperature of at least about 60° C. said first and second mixtures in a ratio of about 100:100 to 100:128; and (D) curing said epoxy resin at a temperature of at least about 105° C.

17. A method according to claim 16 wherein for said first mixture said filler comprises at least about 40 percent by weight of silica having a particle size of 99% finer than 44 microns and 10 percent by weight of calcium carbonate having a particle size of 99.9% finer than 12 microns; and for said second mixture said filler comprises at least about 30 percent by weight of alumina trihydrate having a particle size of 80% finer than 80 microns, 20 percent by weight silica having a particle size of 99% finer than 44 microns and 10 percent by weight of calcium carbonate having a particle size of 99.9% finer than 12 microns.

18. A method according to claim 16 wherein the ratio of raw epoxy resin to raw acid anhydride curing agent is about 0.9 to 1.6.

19. A method according to claim 16 wherein said curing step is at a temperature of at least about 105° C.

20. A method according to claim 16 wherein the resulting cured composition is post-cured at a temperature of least about 125° C.

21. A two-component epoxy resin composition suitable for encapsulating electrical devices and which on curing results in a resin having a dissipation factor of not more than about 1.2% measured at a frequency of 100 kHz to 125° C., which comprises an admixture of a first component and a second component: said first component comprising (i) an epoxy resin selected from a polyglycidal ether of a polyhydroxyl phenol and liquid at room temperature, and (ii) finely divided solid filler comprising silica and calcium carbonate, said filler being at least 50 percent by weight of said first component; and said second component comprising (i) a cycloaliphatic acid anhydride curing agent, (ii) finely divided solid filler comprising silica, hydrated alumina, and calcium carbonate, said filler being at least 50 percent by weight of said second component and (iii) a catalytic amount of a catalyst for accelerating the curing of said epoxy resin of said first component upon admixing of said first component with said second component.

22. A composition according to claim 21 wherein said epoxy resin has an epoxide equivalent weight of 170 to 200, and a viscosity of 40 to 180 poise at 25° C.

23. A composition according to claim 21 wherein said epoxy resin is diglycidal ether of bisphenol-A.

24. A composition according to claim 21 wherein said acid anhydride curing agent is methyl tetrahydrophthalic anhydride.

25. A composition according to any of claims 21, 22, 23 or 24 wherein said catalyst is an imidazole.

26. A composition according to claim 25 wherein said catalyst is present in said second mixture in an amount ranging from about 0.05 to 3.0 percent by weight.

27. A composition according to claim 26 wherein said range is from about 0.1 to 0.3 percent.

28. A composition according to any of claims 21, 22, 23 or 24 wherein said admixture of said first component and said second component is in the ratio, per 100 parts or raw epoxy resin, of from about 70 to 115 percent of the stoichiometric amount of raw acid anhydride.

29. A composition according to any of claims 21, 22, 23 or 24 wherein said admixture is subjected to a vacuum to remove entrained air and volatile organics.

30. A composition according to any of claims 21, 22, 23 or 24 wherein said admixture is cured at a temperature of at least about 105° C.

31. A composition according to claim 30 wherein the resulting cured composition is post-cured at a temperature of least about 125° C.

32. A method for encapsulating an electrical device with an epoxy resin composition which on curing results in a resin having a dissipation factor of not more than about 1.2% measured at a frequencY of 100 kHz to 125° C., which comprises: (A) preparing a first component comprising (i) an epoxy resin consisting essentially of a polyglycidal ether of a polyhydroxyl phenol and liquid at room temperature, and (ii) a finely divided solid filler of silica and calcium carbonate, said filler being at least 50 percent by weight of said first mixture, and admixing said epoxy resin and said filler by applying a high shearing force and drawing a vacuum on said first component; and (B) preparing a second component comprising (i) a cycloaliphatic acid anhydride curing agent, (ii) finely divided solid filler of silica, hydrated alumina, and calcium carbonate, and (iii) a catalytic amount of a catalyst for accelerating the curing of step (E) below, said filler being at least 50 percent by weight of said second mixture, and admixing said curing agent, said filler and said catalyst by applying a high shearing force and drawing a vacuum on said second component; (C) admixing under vacuum said first component and said second component; (D) encapsulating said electrical device with the resulting admixture of step (C) while drawing a vacuum on said resulting admixture, and (E) curing the epoxy resin at an elevated temperature.

33. A method according to claim 32 wherein said epoxy resin has an epoxide equivalent weight of 170 to 200, and a viscosity of 40 to 180 poise at 25° C.

34. A method according to claim 32 wherein said epoxy resin is diglycidal ether of bisphenol-A.

35. A method according to claim 32 wherein said acid anhydride curing agent is methyl tetrahydro-phthalic anhydride.

36. A method according to any of claims 32, 33, 34 or 35 wherein for said first mixture said filler comprises at least about 40 percent by weight of silica having a particle size of 99% finer than 44 microns and 10 percent by weight of calcium carbonate having a particle size of 99.9% finer than 12 microns; and for said second mixture said filler comprises at least about 30 percent by weight of alumina trihydrate having a particle size of 80% finer than 80 microns, 20 percent by weight silica having a particle size of 99% finer than 44 microns and 10 percent by weight of calcium carbonate having a particle size of 99.9% finer than 12 microns.

37. A method according to any of claims 32, 33, 34 or 35 wherein said catalyst is an imidazole.

38. A method according to claim 36 wherein said catalyst is present in said second mixture in an amount ranging from about 0.05 to 3.0 percent by weight.

39. A method according to claim 36 wherein said range is from about 0.1 to 0.3 percent.

40. A method according to any of claims 32, 33, 34 or 35 wherein the ratio of raw epoxy resin to raw acid anhydride curing agent is, per 100 parts by weight of raw resin, from about 70 to 115 percent of the stoichiometric amount of raw acid anhydride.

41. A method according to any of claims 32, 33, 34 or 35 wherein during any of said admixing steps a vacuum is applied to remove entrained air and volatile organics.

42. A method according to any of claims 32, 33, 34 or 35 wherein said curing step is at a temperature of at least about 105° C.

43. A method according to claim 42 wherein the resulting cured composition is post-cured at a temperature of least about 125° C.

* * * * *